(12) United States Patent
Otsuka et al.

(10) Patent No.: US 9,070,441 B2
(45) Date of Patent: Jun. 30, 2015

(54) NON-VOLATILE MEMORY SYSTEM WITH RESET VERIFICATION MECHANISM AND METHOD OF OPERATION THEREOF

(71) Applicant: Sony Corporation, Tokyo (JP)

(72) Inventors: Wataru Otsuka, Boise, ID (US); Jun Sumino, Tokyo (JP); Tomohito Tsushima, Tokyo (JP); Makoto Kitagawa, Boise, ID (US); Takafumi Kunihiro, Tokyo (JP)

(73) Assignee: Sony Corporation, Tokyo (JP)

( * ) Notice: Subject to any disclaimer, the term of this patent is extended or adjusted under 35 U.S.C. 154(b) by 222 days.

(21) Appl. No.: 13/723,965

(22) Filed: Dec. 21, 2012

(65) Prior Publication Data
US 2014/0177316 A1   Jun. 26, 2014

(51) Int. Cl.
G11C 13/00 (2006.01)
H01L 45/00 (2006.01)

(52) U.S. Cl.
CPC ........... *G11C 13/0097* (2013.01); *H01L 45/146* (2013.01); *G11C 13/0011* (2013.01)

(58) Field of Classification Search
CPC ........... G11C 13/0097; G11C 13/0069; G11C 13/004; G11C 13/0011; G11C 13/0002; H01L 45/146

USPC .................................................. 365/148, 158
See application file for complete search history.

(56) References Cited

U.S. PATENT DOCUMENTS

| | | | | |
|---|---|---|---|---|
| 8,593,853 | B2* | 11/2013 | Katoh | 365/148 |
| 8,891,276 | B2* | 11/2014 | Siau et al. | 365/63 |
| 8,937,292 | B2* | 1/2015 | Bateman | 257/5 |
| 2006/0104106 | A1* | 5/2006 | Aratani et al. | 365/148 |
| 2009/0323405 | A1* | 12/2009 | Jung et al. | 365/158 |
| 2011/0038195 | A1* | 2/2011 | Hamilton et al. | 365/148 |
| 2012/0147689 | A1 | 6/2012 | Scheuerlein et al. | |
| 2012/0163066 | A1 | 6/2012 | Maejima | |
| 2012/0166901 | A1 | 6/2012 | Kim | |
| 2012/0168706 | A1 | 7/2012 | Noh et al. | |
| 2012/0211719 | A1 | 8/2012 | Haimoto et al. | |
| 2012/0212994 | A1* | 8/2012 | Tsushima et al. | 365/148 |

* cited by examiner

*Primary Examiner* — Han Yang
*Assistant Examiner* — Xiaochun L Chen
(74) *Attorney, Agent, or Firm* — Ishimaru & Associates LLP

(57) ABSTRACT

A method of operation of a non-volatile memory system includes: providing a resistive storage element having a high resistance state and a low resistance state; coupling an analog multiplexer to the resistive storage element for applying a bias voltage; and switching between a verification bias and a read bias through the analog multiplexer for increasing a read margin between the high resistance state and the low resistance state.

20 Claims, 3 Drawing Sheets

NON-VOLATILE MEMORY SYSTEM WITH RESET VERIFICATION MECHANISM AND METHOD OF OPERATION THEREOF

TECHNICAL FIELD

The present invention relates generally to a memory system, and more particularly to a system for managing group erase of individual cells in a non-volatile memory array.

BACKGROUND ART

The performance of non-volatile memory systems has improved over the past several years. Changes in technology management have pushed the non-volatile memory devices into cameras, computers, personal data assistants, smart phones, and proprietary business applications.

The current flash memory devices, based on charge storage technologies, have limited life spans due to damage of the charge storage layers during writes. The damage can be caused by physical weakening of the crystal structure used to store the charge. This condition is countered by limiting the number of writes and reads that an individual memory cell can undergo. The limited reliability of the cells has given rise to error correction strategies and distributed write operations in order to extend the useable life of the memory modules.

Other non-volatile memory technologies are in development that can increase the useable memory density while extending the lifetime reliability of the memory structures. These non-volatile memory technologies include spin transfer torque random access memory (STT-RAM) and resistive random access memory (R-RAM).

While the write of the individual cells can be grouped by a byte or word organization, the erase is performed on a block basis. The block erase can simultaneously erase 4K cells. An issue that has arisen in the new R-RAM technology is that the block erase may have insufficient current to reset all of the individual cells in the erase block. Some percentage of the cells can require additional voltage or current in order to switch states. This condition can be caused by the number of written cells in the erase block and the manufacturing distribution of the individual integrated circuit.

In order to verify that all of the individual cells were properly erased, the erase process may be repeated iteratively in order to assure all of the individual cells were actually erased. The iterative erase cycles can consume additional power and increase background processing time.

Thus, a need still remains for a non-volatile memory system that can reduce or eliminate the need for an iterative erase cycles process. In view of the exponential growth in the use of non-volatile memory in personal electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a non-volatile memory system including: providing a resistive storage element having a high resistance state and a low resistance state; coupling an analog multiplexer to the resistive storage element for applying a bias voltage; and switching between a verification bias and a read bias through the analog multiplexer for increasing a read margin between the high resistance state and the low resistance state.

The present invention provides a non-volatile memory system, including: a resistive storage element having a high resistance state and a low resistance state; an analog multiplexer coupled to the resistive storage element for applying a bias voltage; and a read reference generator provides a verification bias and a read bias through the analog multiplexer for increasing a read margin between the high resistance state and the low resistance state.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
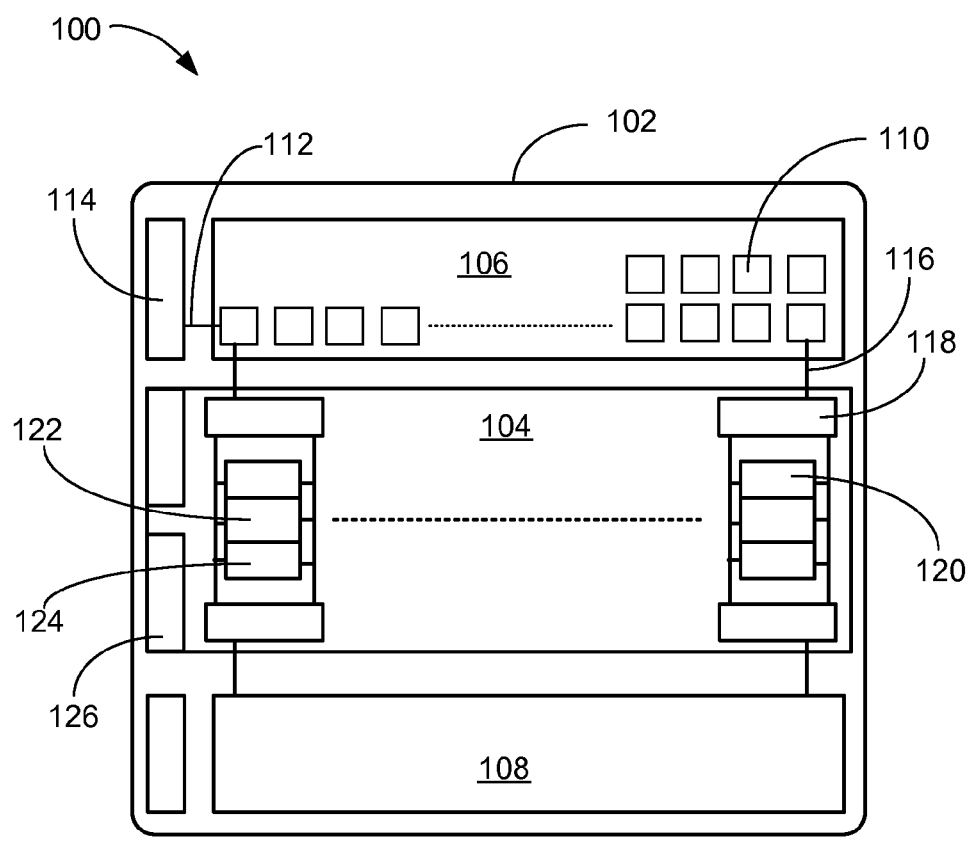
FIG. 1 is a block diagram of a non-volatile memory system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. For expository purposes, the term "horizontal" as used herein is defined as a plane parallel to the plane or surface of the integrated circuit, having the non-volatile memory system, regardless of its orientation.

The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The phrase "directly on" means that there is direct contact between elements with no intervening elements.

The term "processing" as used herein includes deposition of material or photoresist, patterning, exposure, development, etching, cleaning, and/or removal of the material or photoresist as required in forming a described structure. The phrase "resistive memory" is defined to be a semiconductor structure that has cells that are programmable between a low resistance state and a high resistance state, where the high resistance state is at least an order of magnitude higher resistance value than the low resistance state. The phrase "direct contact" means that no intervening materials are involved in the interface between elements.

Referring now to FIG. 1, therein is shown a block diagram of a non-volatile memory system 100 in an embodiment of the present invention. The block diagram of the non-volatile memory system 100 depicts an integrated circuit die 102 having a control block 104 positioned between a first memory array 106 and a second memory array 108. The first memory array 106 and the second memory array 108 include the non-volatile memory cells 110 as well as the interconnect layers 112.

A word line driver 114 can be positioned adjacent to the first memory array 106 and the second memory array 108. The word line driver 114 can control the word line address on the interconnect layers 112. The word line driver 114 can coordinate the addressing of blocks or individual instances of the non-volatile memory cells 110 with the assistance of the control block 104.

The control block 104 can propagate a bit line and control bus 116 in coordination with the word line driver 114 in order to address the non-volatile memory cells 110 within the first memory array 106 and the second memory array 108. The bit line and control bus 116 can select and control the individual instances of the non-volatile memory cells 110. The control block 104 has several instances of an analog multiplexer 118. The analog multiplexer 118 can propagate signals in two directions concurrently.

A read reference generator 120, coupled to the analog multiplexer 118, can provide bias voltages for the non-volatile memory cells 110 during reset verification and reading processes. A write driver 122 can be coupled to the analog multiplexer 118 for conditioning selected of the non-volatile memory cells 110 during write operations. A sense amplifier 124 can be coupled to the analog multiplexer 118 for monitoring transitions of the resistive state of the non-volatile memory cells 110.

A plate voltage driver 126 can establish the reference voltage while writing, resetting, or reading. The plate voltage driver 126 can manage several concurrent processes. The geometry of the first memory array 106 and the second memory array 108 can interleave write processes, reset processes, and read processes. The concurrent processes can be allocated to different regions of the first memory array 106 and the second memory array 108.

It has been discovered that the non-volatile memory system 100 can provide a highly reliable, manufacturable, and good yielding integrated circuit solution for high capacity and long term non-volatile memory applications. The non-volatile memory cells 110 highly manufacturable and their manipulation by the control block 104 provides extra margin to the operation of the non-volatile memory system 100. The non-volatile memory system 100 can be fabricated in complementary metal oxide semiconductor (CMOS) processes, such as 180 ηm CMOS technology.

It is understood that the display of the non-volatile memory cells 110 is an example only and a different number and configuration of the non-volatile memory cells 110 is likely. It is further understood that the configuration of the first memory array 106 and the second memory array 108 can be the same in order to provide distributed and balanced processing across the non-volatile memory system 100.

Figure 2:
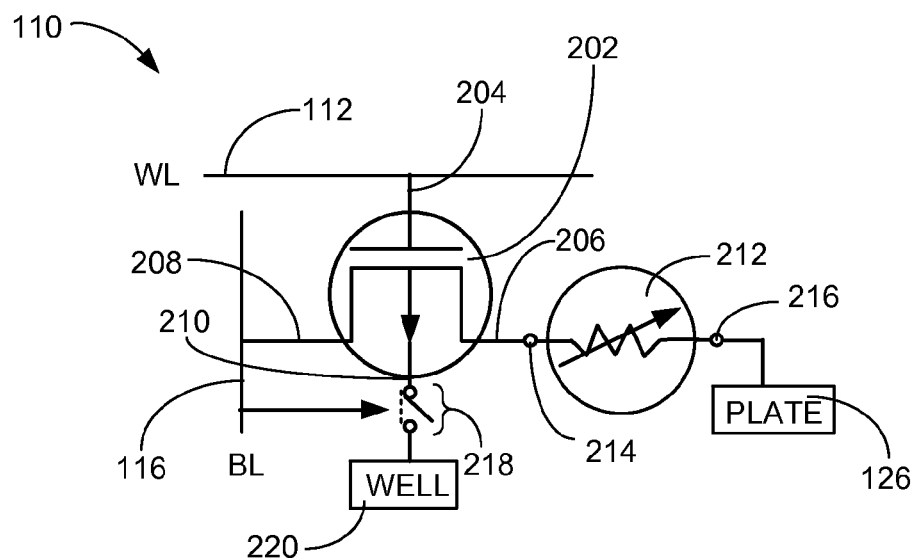
FIG. 2 is a schematic diagram of an instance of the non-volatile memory cells.

Referring now to FIG. 2, therein is shown a schematic diagram of an instance of the non-volatile memory cells 110. The schematic diagram of the non-volatile memory cells 110 depicts a control field effect transistor 202, such as a P-FET, having a gate electrode 204, a source electrode 206, a drain electrode 208, and a body-tie electrode 210.

The interconnect layer 112 can be coupled between the word line driver 114 of FIG. 1 and the gate electrode 204 of the control field effect transistor 202. It is understood that the interconnect layer 112 can be coupled to other instances of the control field effect transistor 202 for forming an array.

The bit line and control bus 116 can be coupled to the drain electrode 208 of the control field effect transistor 202. It is understood that the bit line and control bus 116 can be coupled to other instances of the control field effect transistor 202 that are coupled to a different instance of the interconnect layer 112 for forming the first memory array 106 of FIG. 1 and the second memory array 108 of FIG. 1.

A resistive storage element 212 can be coupled to the source electrode 206 of the control field effect transistor 202 through a first electrode 214. The resistive storage element 212 can have a second electrode 216 that is coupled to a plate voltage driver 126. When programming the resistive storage element 212, the plate voltage can be between 1.0 and 3.5 volts. When resetting the resistive storage element 212, the plate voltage driver 126 can propagate substantially ground or Vss. The plate voltage driver 126 can provide a reference voltage when programming or resetting the resistive storage element 212.

A well switch 218 can be coupled between the body-tie electrode 210, of the control field effect transistor 202, and a well voltage 220. During programming and reading operations the well switch 218 is closed in order to reference the voltage at the source electrode 206 to the well voltage 220. It is understood that the well voltage 220 can reflect the voltage in the well region, in which the control field effect transistor 202 is fabricated. The well voltage 220 can be in the range of 0 to 0.7 volts.

During the reset operation of the non-volatile memory system 100 of FIG. 1, the well switch 218 can be opened for a period φ and then return to a closed position in order to prevent a latch-up condition in the control field effect transistor 202. During the period φ, with the well switch 218 open, the well voltage 220 can increase from 0 volts due to charge accumulation in the well region.

The open state of the well switch 218 can provide a higher voltage at the first electrode 214 of the resistive storage element 212 for executing a reset of the resistive storage element 212. The well switch 218 must be closed after the period φ in order to prevent latch-up of the control field effect transistor 202.

It has been discovered that the opening of the well switch 218 for the period φ during the reset of the resistive storage element 212 can provide additional voltage across the resistive storage element 212 that is not available when the well switch 218 is closed. The presence of the additional voltage can provide a faster and more certain transition of the resistive storage element 212 between the low resistance state and the high resistance state.

Figure 3:
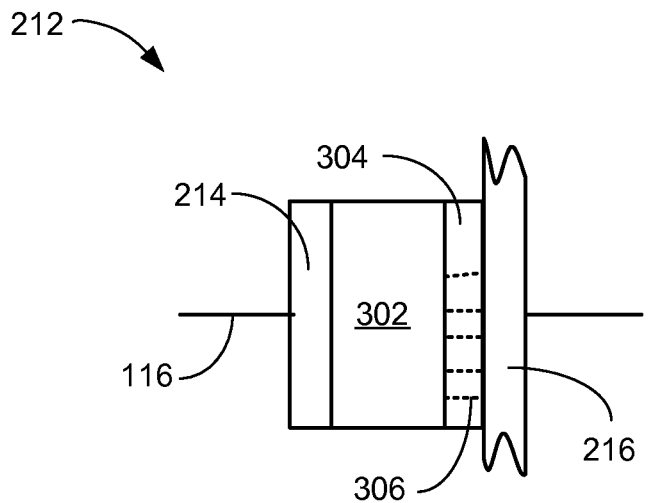
FIG. 3 is a cross-sectional view of the resistive storage element.

Referring now to FIG. 3, therein is shown a cross-sectional view of the resistive storage element 212. The cross-sectional view of the resistive storage element 212 depicts the first electrode 214 in direct contact with a conductive layer 302. The first electrode 214 can be a metal structure formed of nickel (Ni), tin (Sn), copper (Cu) or an alloy of a conductive metal. The conductive layer 302 can be alloys of Tellurium (Te), known as Telluride, such as Copper-Tellurium (CuTe).

A transformation layer 304 is in direct contact with the conductive layer 302. The transformation layer 304 can be gadolinium oxide (GdOx) and provides a switching function that can conduct electrons between the conductive layer 302 and the second electrode 216. The transformation layer 304 can be altered by applying a voltage across the first electrode 214 and the second electrode 216. The application of the voltage can cause ions from the conductive layer 302 to migrate into the transformation layer 304 in order to form conductive threads 306 through the transformation layer 304. By reversing the polarity of the voltage across the first electrode 214 and the second electrode 216, the conductive threads 306 can be broken and the ions will migrate back into the conductive layer 302 and returning the transformation layer 304 to its initial resistive state.

It has been discovered that the resistive storage element 212 can maintain a resistive state without an electrical supply and can transition between resistive states, by the application of a low voltage direct current signal, with high reliability. Once the conductive threads 306 are formed between the conductive layer 302 and the second electrode 216, they will remain in place until they are forces to break by applying the reverse voltage.

It is understood that the method of fabrication of the resistive storage element 212 can be in a different orientation than what is shown. The first electrode 214 and the second electrode 216 can be coupled to the bit line and control bus 116 for connection to the analog multiplexer 118 of FIG. 1 and the sense amplifier 124 of FIG. 1.

Figure 4:
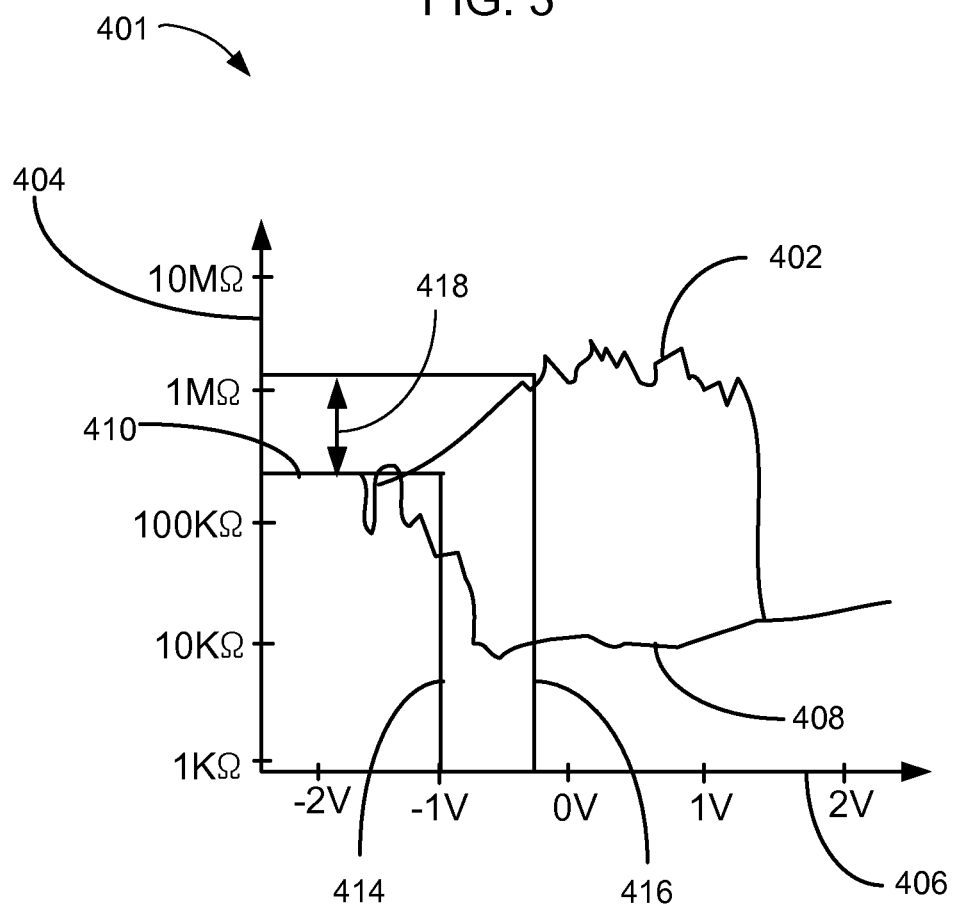
FIG. 4 is a plot of resistive characteristics of the resistive storage element.

Referring now to FIG. 4, therein is shown a plot of resistive characteristics 401 of the resistive storage element 212 of FIG. 2. The plot of the resistive characteristics 401 depicts a high resistance state 402, captured by monitoring a resistance 404 across the range of bias voltages 406, and a low resistance state 408 captured in the same way.

A high resistance verification threshold 410 can be established by overdriving the bias voltage 406 to a verification bias 414, wherein the verification bias 414 is ten times the read bias 416. The resistance 404 remains in excess of MO under the read bias 416. The increased value of the verification bias 414 causes the high resistance state 402 to decrease toward the high resistance verification threshold 410. If any of the resistive storage element 212 is read below the high resistance verification threshold 410, it would be subjected to an iterative reset process in order to completely break down the conductive threads 306 of FIG. 3 in the transformation layer 304 of FIG. 3.

It has been discovered that the application of the verification bias 414, in response to the reset of the resistive storage element 212, can provide in excess of 2 orders of magnitude difference in the resistance 404 between the high resistance state 402 and the low resistance state 408. It is understood that the additional read margin provided by the application of the verification bias 414 translates into better read reliability for the resistive storage element 212.

It is further understood that the read bias 416 can be set to −0.1V while the verification bias 414 is set to −1.0V. It is understood that the analog multiplexer 118 of FIG. 1 can dynamically switch between the verification bias 414 and the read bias 416 when addressing the resistive storage element 212 in a reset phase of operation or a read phase of operation, respectively. This process can increase a read margin 418 of the resistive storage element 212.

It has been discovered that the increase in separation of the resistance 404 values between the high resistance state 402 and the low resistance state 408 can provide for the use of less complicated hardware in the read circuitry and the sense amplifier 124 of FIG. 1.

Figure 5:
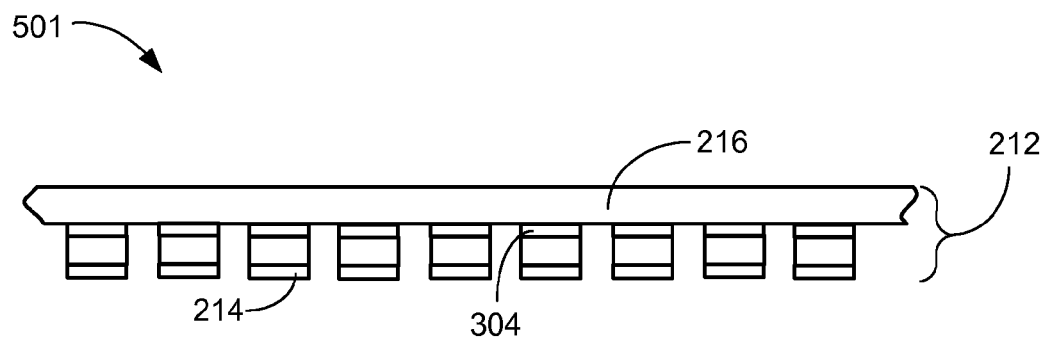
FIG. 5 is a cross-sectional view of an array of the resistive storage element.

Referring now to FIG. 5, therein is shown a cross-sectional view of an array 501 of the resistive storage element 212. The cross-sectional view of the array 501 depicts the resistive storage element 212. The second electrode 216 can extend over a number of the transformation layer 304. Each of the resistive storage element 212 can have a separate first electrode 214.

During the reset process, the second electrode 216 is set to $V_{ss}$ and each of the first electrode 214 is elevated to a reset voltage as represented by $V_{bs}$ which can include an added voltage delta caused by allowing the well voltage 220 to float by opening the well switch 218 of FIG. 2 for a period $\phi$ controlled by the control block 104 of FIG. 1. It is understood that the management of the period $\phi$ by the control block 104 is critical to prevent a latch-up condition in the integrated circuit die 102 of FIG. 1.

It is understood that the first memory array 106 and the second memory array 108 can be divided into subsections called erase blocks. Each of the erase blocks can include hundreds or thousands of the individual instances of the resistive storage elements 212 joined by the second electrode 216. The reset of all of the individual instances of the resistive storage elements 212 joined by the second electrode 216 can occur concurrently.

Figure 6:
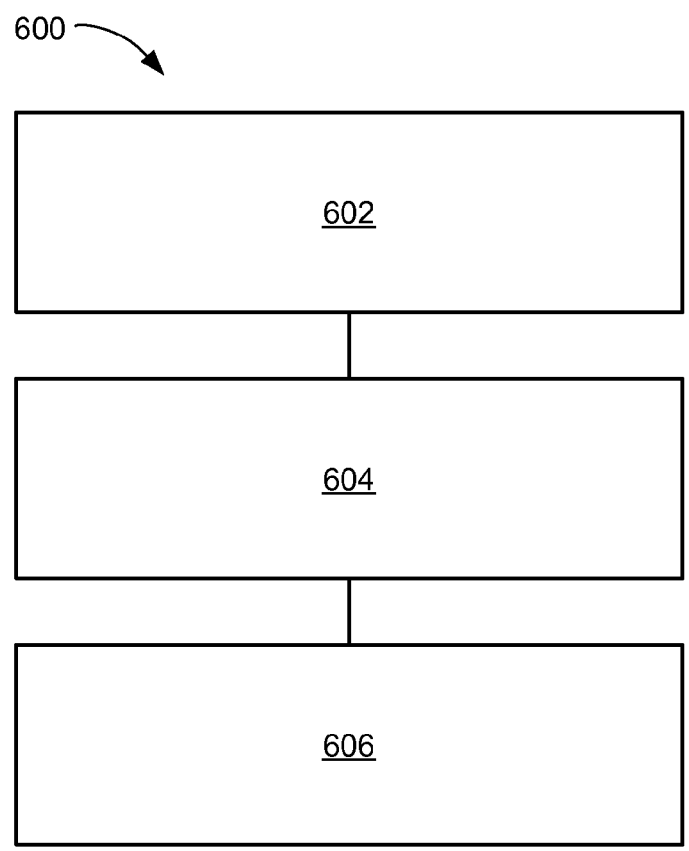
FIG. 6 is a flow chart of a method of operation of a non-volatile memory system in a further embodiment of the present invention.

Referring now to FIG. 6, therein is shown a flow chart of a method 600 of operation of a non-volatile memory system in a further embodiment of the present invention. The method 600 includes: providing a resistive storage element having a high resistance state and a low resistance state in a block 602; coupling an analog multiplexer to the resistive storage element for applying a bias voltage in a block 604; and switching between a verification bias and a read bias through the analog multiplexer for increasing a read margin between the high resistance state and the low resistance state in a block 606.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or

What is claimed is:

1. A method of operation of a non-volatile memory system comprising:
   providing a resistive storage element having a high resistance state and a low resistance state;
   coupling an analog multiplexer to the resistive storage element for applying a bias voltage; and
   switching between a verification bias and a read bias through the analog multiplexer for increasing a read margin between the high resistance state and the low resistance state including asserting a well switch for referencing the bias voltage to a well voltage.

2. The method as claimed in claim 1 further comprising accessing a sense amplifier coupled to analog multiplexer for monitoring a resistance.

3. The method as claimed in claim 1 wherein applying the bias voltage includes monitoring a high resistance verification threshold.

4. The method as claimed in claim 1 further comprising activating a plate voltage driver for establishing a reference voltage for the resistive storage element.

5. The method as claimed in claim 1 further comprising coupling a control field effect transistor for selecting the resistive storage element.

6. A method of operation of a non-volatile memory system comprising:
   providing a resistive storage element having a high resistance state and a low resistance state including forming conductive threads in the low resistance state;
   coupling an analog multiplexer to the resistive storage element for applying a bias voltage including coupling a bit line and control bus for applying the bias voltage; and
   switching between a verification bias and a read bias through the analog multiplexer for increasing a read margin between the high resistance state and the low resistance state including asserting a well switch for referencing the bias voltage to a well voltage when activating a read reference generator for establishing the verification bias to be ten times the voltage of the read bias.

7. The method as claimed in claim 6 further comprising accessing a sense amplifier coupled to analog multiplexer for monitoring a resistance of the resistive storage element including comparing a high resistance verification threshold against the resistance.

8. The method as claimed in claim 6 wherein applying the bias voltage includes monitoring a high resistance verification threshold including activating a word line driver for selecting the resistive storage element to compare against the high resistance verification threshold.

9. The method as claimed in claim 6 further comprising activating a plate voltage driver for establishing a reference voltage for the resistive storage element including coupling a second electrode of the resistive storage element to the reference voltage and coupling the first electrode of the resistive storage element to the bias voltage.

10. The method as claimed in claim 6 further comprising coupling a control field effect transistor for selecting the resistive storage element including activating a word line driver and a bit line and control bus for addressing a specific instance of the resistive storage element.

11. A non-volatile memory system comprising:
    a resistive storage element having a high resistance state and a low resistance state;
    an analog multiplexer, coupled to the resistive storage element, for applying a bias voltage; and
    a read reference generator provides a verification bias and a read bias through the analog multiplexer for increasing a read margin between the high resistance state and the low resistance state includes a well switch coupled between a well voltage and the read reference generator for referencing the bias voltage to a well voltage.

12. The system as claimed in claim 11 further comprising a sense amplifier, coupled to analog multiplexer, for monitoring a resistance of the resistive storage element.

13. The system as claimed in claim 11 wherein the bias voltage applied provides a high resistance verification threshold compared to the resistance of the resistive storage element.

14. The system as claimed in claim 11 further comprising a plate voltage driver activated for establishing a reference voltage for the resistive storage element.

15. The system as claimed in claim 11 further comprising a control field effect transistor for selecting the resistive storage element.

16. The system as claimed in claim 11 further comprising:
    conductive threads formed in the resistive storage element provides low resistance state;
    a bit line and control bus for applying the bias voltage to the resistive storage element; and
    a read reference generator sets the verification bias to be ten times the voltage of the read bias.

17. The system as claimed in claim 16 further comprising a sense amplifier, coupled to analog multiplexer, for monitoring a resistance of the resistive storage element includes a high resistance verification threshold compared against the resistance.

18. The system as claimed in claim 16 wherein the bias voltage applied to the resistive storage element provides a high resistance verification threshold and the resistive storage element, selected by a word line driver, is compared against the high resistance verification threshold.

19. The system as claimed in claim 16 further comprising a plate voltage driver establishes a voltage reference for the resistive storage element includes a second electrode of the resistive storage element coupled to the voltage reference and a first electrode of the resistive storage element coupled to the bias voltage.

20. The system as claimed in claim 16 further comprising a control field effect transistor for selecting the resistive storage element activated includes a word line driver and a bit line and control bus for addressing a specific instance of the resistive storage element.

* * * * *